United States Patent [19]

Furtek

[11] Patent Number: 4,845,633

[45] Date of Patent: Jul. 4, 1989

[54] SYSTEM FOR PROGRAMMING GRAPHICALLY A PROGRAMMABLE, ASYNCHRONOUS LOGIC CELL AND ARRAY

[75] Inventor: Frederick C. Furtek, Arlington, Mass.

[73] Assignee: Apple Computer Inc., Mountainview, Calif.

[21] Appl. No.: 76,050

[22] Filed: Jul. 21, 1987

Related U.S. Application Data

[62] Division of Ser. No. 803,536, Dec. 2, 1985.

[51] Int. Cl.[4] ............. G06F 15/60; H01L 27/10
[52] U.S. Cl. ................................ 364/490; 307/465; 340/825.83; 357/45; 364/521
[58] Field of Search ............ 307/465; 340/825.83, 340/825.87, 825.89; 357/45; 364/488, 489, 490, 491, 521

[56] References Cited

U.S. PATENT DOCUMENTS

| Re. 31,287 | 6/1983 | Patil | 340/825.79 |
|---|---|---|---|
| 3,731,073 | 5/1973 | Moylan | 307/465 X |
| 3,912,914 | 10/1975 | Moylan | 307/465 X |
| 4,068,214 | 1/1978 | Patil | 340/825.87 |
| 4,293,783 | 10/1981 | Patil | 307/465 |
| 4,414,547 | 11/1983 | Knapp et al. | 340/825.83 |
| 4,422,072 | 12/1983 | Cavlan | 340/825.87 |
| 4,431,928 | 2/1984 | Skokan | 357/45 X |
| 4,451,895 | 5/1984 | Sliwkowski | 364/521 |
| 4,642,487 | 2/1987 | Carter | 307/465 |
| 4,700,187 | 10/1987 | Furtek | 357/45 X |

FOREIGN PATENT DOCUMENTS 0094234 11/1983 European Pat. Off. .
0204034 12/1986 European Pat. Off. .

OTHER PUBLICATIONS

Kukreja et al.: "Combinational and Sequential Cellular Structures," *IEEE Transactions on Computers*, V. C–22, No. 9, No. 9, 9/73, pp. 813–823.
F. B. Mannings: "An Approach to Highly Integrated, Computer-Maintained Cellular Arrays," *IEEE Transactions on Computers*, vol. C–26, No. 6, 6/77, pp. 536–552.
Krug et al.: "Abaenderbare Gatter-Anordnungen," *Elektronik*, vol. 35, No. 22, 10/86, pp. 170–171, 174–176.
P. King: "Subcircuits on Linear Arrays-A New Array Topology", *IEEE Proceedings, of the IEEE* 1985 *Custom Integrated Circuits Conference*, 5/85, pp. 470–474.

(List continued on next page.)

Primary Examiner—Parshotam S. Lall
Assistant Examiner—Edward R. Cosimano
Attorney, Agent, or Firm—Wolf, Greenfield & Sacks

[57] ABSTRACT

A system for programming an asynchronous logic cell and a two- or three-dimensional array formed of such cells. Each cell comprises a number of exclusive-OR gates, Muller C-elements and programmable switches. The logic cell is reprogrammable and may even be reprogrammed dynamically, such as to perform recursive operations or simply to make use of hardware which is temporarily idle. Programming is accomplished by setting the states of the switches in each cell. A user-friendly programming environment facilitates the programming of the switches. The programming system facilitates the construction of circuits, circuit modules, black box elements and the like, with provision for storing such building blocks in a library for future reference. With an adequate library, custom hardware can be designed by simply mapping stored blocks onto chips and connecting them together. Further, because the array is regular and switch settings can produce logical wires, crossovers, connections and routings running both "horizontally" and "vertically", it is in general possible to "wire around" defective elements. If a large wafer contains defective cells, those cells can simply be avoided and bypassed, with the remainder of the wafer remaining useful. The programming system facilitates the rotation and reflection of blocks, to exploit the symmetry of the array and minimize unproductive cell area. The user is can see a representation of the chip as it is transformed by programming.

18 Claims, 12 Drawing Sheets

OTHER PUBLICATIONS

R. F. Hartmann: "CMOS Erasable Programmable Logic Devices TTL Replacement Made Easy," *Electro and Mini-Micro Northeast Conference Record*, 4/85, pp. 1–9.

Karatsu et al.: "An Integrated Design Automation System for VLSI Circuits," *IEEE Design & Test of Computers*, vol. 2, No. 5, 10/85, pp. 17–26.

*Xilinx and Hamilton/Avnet Present Logic Cell Arrays TM the User Programmable Gate Arrays*, Xilinx, Inc., no date.

L. Snyder, "Introduction to the Configurable, Highly Parallel Computer", *IEEE Computer*, Jan. 1982, pp. 47–55.

D. Misunas, "Petri Nets and Speed Independent Design," *Comm. of the ACM*, vol. 16, No. 8, Aug. 1973, pp. 474–481.

T. Agerwala, "Putting Petr. Nets to Work," *IEEE Computer*, Dec. 1979, pp. 85–94.

C. Seitz, "Concurrent VLSI Architectures", *IEEE Trans. on Computers*, vol. C-33, No. 12, Dec. 1984 at pp. 1247–1265.

L. Snyder, "Parallel Programming and the Poker Programming Environment," *IEEE Computer*, Jul. 1984, pp. 27–33.

"Storage/Logic Arrays Finally get Practical," *Electronics*, Jan. 20, 1986, at pp. 29–33.

P. Israelson et al., "Comparison of the Path Programmable Logic Design Methodology . . . ", Proc. IEEE Int'l. Conf. on Computers Design, Oct. 10, 1985, pp. 73–76.

R. Collett, "Programmable Logic Soars Into New Dimensions," *Digital Design*, Apr. 1985, pp. 42–54.

D. Wills, "Ultra-Fine Grain Processing Architectures", M.I.T. VLSI Memo No. 85-245, May 1985.

(A)   (B)   (C)

SYSTEM FOR PROGRAMMING GRAPHICALLY A PROGRAMMABLE, ASYNCHRONOUS LOGIC CELL AND ARRAY

CROSS-REFERENCE TO RELATED APPLICATIONS

This is a division of Ser. No. 06/803,536, filed Dec. 2, 1985.

FIELD OF THE INVENTION

Aspects of this invention pertain to several interrelated fields. These fields include digital logic circuits, programmable and reprogrammable logic devices, the architecture of computing structures, and computer-aided design systems. More particularly, the invention involves a system for programming a reprogrammable, asynchronous logic cell which may be configured in an arbitrarily large two-dimensional (or three-dimensional) array of such cells to perform virtually any logic operation. The invention is particularly well-suited to the implementation of logic circuits and systems that can be characterized as a class of Petri Nets.

BACKGROUND OF THE INVENTION

In the field of systems design, considerable attention has been devoted to the analysis and synthesis of so-called concurrent systems—that is, systems in which various events may occur in an arbitrary order relative to one another, such order not being known or ascertainable at the time the system (or one's analysis of the system) is started. Concurrent systems are important in, among other areas, logic design and computer architecture. In those areas, concurrent systems are viewed as useful for providing more processing power and speed than can a conventional single processor or sequential logic system.

For nearly half a century, general purpose digital computers have been based on the so-called Von Neumann model of a central processing unit connected to a random-access memory in which a program may be stored. The operation of such machines is inherently sequential; that is, the processor performs only one operation at a time, in an order defined by the program. In recent years, there has been a concerted effort to develop computers capable of ever greater performance (defined as the ability to perform more computations of a given type in a unit of time—the measure typically used is the number of millions of instructions per second, MIPS, or the number of floating point operations per second, FLOPS, which the computer can execute). System speed has been improved by increasing the operating speed of individual processors, and by the development and use of multi-processor architectures (particularly architectures employing multiple microprocessors) and so-called distributed and parallel processing arrangements. One interesting multi-processor system is the so-called "Configurable, Highly Parallel," or "CHiP", computer and its "Poker" parallel programming environment, which was developed at Purdue University, as described in L. Snyder, "Parallel Programming and the Poker Programming Environment," *IEEE Computer*, July 1984, at 27. The CHiP computer comprises a rectangular array of microprocessors in which each microprocessor is connectable to its neighbors through simple switches.

Such advances in architecture, however, are not without their disadvantages. When multiple processors are employed, a considerable amount of overhead is added, simply to coordinate the activities of the various computing elements. Moreover, each processor is typically still a Von Neumann machine, so it can only execute one operation at a time. Thus concurrency can only be achieved at that granularity or higher. Increasing the number of processors operating in parallel, to increase concurrency, unfortunately requires a disproportionate increase in the housekeeping tasks required for coordination of their activities.

Further, the concept of doing one thing at a time usually pervades the design of each single processor. That is, a given operation may only require the use of a small portion of a processor's logic; the remainder of its logic circuits may remain idle and unproductive while the operation is being performed. This is largely a result of using a microprocessor, or the like, as the kernel of processing power.

When speed of operation is a factor, however, microprocessors may not provide an adequate solution to a problem; even relatively simple tasks may require so many instruction cycles to accomplish that the effective speed of the microprocessor may not be sufficient.

Against this background, it has been observed that many complex and demanding problems can be formulated for execution with large degrees of concurrency—in the thousands, or even millions, of loosely coupled processes.

The development of concurrent or parallel processing environments has not relied solely on multi-microprocessor architectures. Some non-Von Neumann architectures have been proposed or built. However, they have either been confined to special purpose environments or they have failed to provide sufficient performance advantages to justify their cost.

Of course, there have also been developments in the areas of logic circuit design, including the design of general purpose logic arrays, including arrangements such as programmable logic arrays (PLA's). However, various problems have been identified with programmable logic devices, among which are the following: (1) lack of silicon efficiency—due to the fact that programming such devices by blowing fuses inherently wastes large numbers of gates; (2) lack of nondestructive testing techniques in those situations where gates can only be checked by blowing fuses; (3) lack of reprogrammability of many such devices, such as those in which fuses are blown; (4) structure which is too rigid, causing the user to encounter difficulties in implementing circuits; (5) lack of sufficient exclusive-OR gates for the implementation of complex arithmetic logic; and (6) undesirable tradeoffs between speed, power and function. The latter complaint reflects the fact that many programmable logic devices have been implemented with bipolar technology. Recently, some of these problems have been reduced in magnitude by the use of CMOS fabrication technology and the advent of erasable programmable logic which uses EPROM cells instead of fuses, to program the device.

There is thus widespread recognition of the desirability and promise of an uncommited array of logic devices which can be transformed into an application-specific integrated circuit. Prior attemps to provide such devices, however, have encountered problems such as those discussed above, as well as problems providing sufficiently general functionality. Additionally, the user must have a detailed technical knowledge of the underlying circuitry and of how to make use of that circuitry.

One of the more interesting attempts to achieve a general purpose structure is shown in U.S. Pat. No. 4,068,214, issued Jan. 10, 1987 to Suhas S. Patil. That patent discloses an asynchronous logic array usable in implementing a large class of Petri Nets. Digressing briefly, a Petri Net is a formal model for concurrent systems. Petri Nets may be used to model a wide range of systems, and can represent arbitrarily complex behavior. The mathematical definition of a Petri Net is well-known and can be found in any of a number of references. One good discussion is contained in T. Agerwala, "Putting Petri Nets to Work," *IEEE Computer*, December 1979, at 85–94, which is hereby incorporated by reference for its discussion of Petri Nets. For the purpose of establishing the lexicon, however, it is appropriate to note that a Petri Net is a bipartite, directed graph N=(T,P,A), where T denotes a set of "transitions" (or "events"), P is a set of "places" (or "states") and A is a set of directed arcs from transitions to places and vice versa. The union of transitions and places defines the "nodes" of the system. "Tokens" may be assigned to places in the net. A transition is said to be "enabled" in a Petri Net if each of its input places has a token. An enabled transition can "fire" by removing a token from each of its input places and putting a token in each of its output places. Tokens are indivisible; that is, a token can be removed from a place by only one transition. In general, the firing of transitions proceeds asynchronously.

It merits comment that Petri Nets can represent both concurrency and conflict, for much of their power flows from this property. "Concurrency" means that transitions are relatively independent; that is, the firing of a pair of transitions can occur in an arbitrary order if both transitions are enabled and the transitions do not share input places. "Conflict" occurs when two transitions that share an input place are enabled at the same time, such that the firing of one of those transitions disables the other.

The transitions, places and tokens of Petri Net are readily mapped to the variables occurring in physical systems. For example, a net could represent a manufacturing plant, with input places representing materials reaching work stations, transitions representing processing taking place at the work station, output places representing the results of the work station's operation and tokens representing the quanta of material required to reach a work station before it can perform its processing. Digital systems (both synchronous and asynchronous) are also readily representable using Petri Nets. .

The use of Petri Nets for system modelling makes available a variety of techiques for system synthesis and analysis.

The implementation of Petri Nets in computer circuitry (i.e., digital logic) has been studied by others, and various types of ciruitry have been proposed for such implementations. Frequently, the goal has been to provide a general-purpose implementation of Petri Nets, capable of embodying all or nearly all types of Petri Nets. According to one approach, circuit modules are substituted directly for transitions and places. However, due to the need to account for all types of Petri Nets, this generally has led to circuit realizations that are fairly complex. Another approach has been to provide a basic collection of Petri Net functions and corresponding speed-independent hardware blocks. Complete circuits are assembled directly from these blocks. A transistor-level implementation has also been described in the literature for various circuits which can be combined to create realizations for Petri Nets of different types. See E. Pacas-Skewes, "A Design Methodology for Digital Systems Using Petri Nets," PhD diss,. Univ. of Texas at Austin, 1979. The Pacas-Skewes approach, however, does not involve reprogrammable logic or the use of regular arrays of devices. Still another implementation is shown in U.S. Pat. No. 4,068,214 to Patil. There, Patil describes an asynchronous logic array, but that array implements control structures, not data structures. The array is said to consist of columns and rows. The rows act as transitions and alter the states of the columns, which act as places. Normally rows operate independently of each other, but sometimes a device called an arbiter is employed to ensure that rows connected to it fire one at a time, in accordance with some priority scheme.

Another structure has been described in S.S. Patil and T. A. Welch, "A Programmable Logic Approach for VLSI," *IEEE Transactions on Computers*, Vol. C-28, No. 9, September 1979, at 594–601. The Patil and Welch structure is a form of programmable logic array which provides conventional AND and OR functions, while also containing flip-flops distributed throughout the array. It allows portions of the array to be used for independent tasks and can be operated in synchronous or asynchronous modes. However, there are restrictions on the segmentation of areas of the array inasmuch as control is row and column oriented. Columns may be divided into independent column segments at points provided, typically, every eight rows; while rows may be divided into independent row segments at breakpoints provided, typically, every four columns. Every column segment must contain at least one flip-flop. Each logical column can either act as a stored binary variable, or it can perform the logical OR function of the row inputs. When the column segment represents a stored variable, the values can be set and reset by the rows. Each row is an implicant or conjunction term over the selected column variables; a column input may be either the column value, its complement or there may be no connection from the column to that row. These variables are ANDed to form the row value. Through this structure is interesting, it is not designed to implement Petri Nets directly. Further, it is unclear that this approach is adaptable to a practical design environment for constructing complex systems.

It is, therefore, an object of the present invention to provide a computational apparatus and architecture in which concurrency can be extended to a much lower level than has generally been heretofore achieved.

It is a further object of the invention to provide a computational apparatus and method which provides a greater degree of concurrency than has previously been achieved.

Still another object of the invention is a universal digital logic circuit which can be employed to implement a large class of logic operations.

Yet another object of the invention is to provide a reprogrammable digital logic device which can be programmed and reprogrammed easily to implement a large class of logic operations.

Another object of the invention is to provide a reprogrammable digital logic device which can be programmed and reprogrammed easily to realize a large class of Petri Nets.

Another object of the invention is to provide a method and an environment to facilitate the programming of the reprogrammable logic device and systems employing the reprogrammable logic device.

A still further object of the invention is to provide reprogrammable logic and a user-friendly programming environment therefor, to reduce the time required for the development of a large class of digital systems.

Yet another object of the invention is to allow a manufacturer or system developer to work with a reduced parts inventory for digital logic, by providing a reprogrammable logic element which is usable for implementing a large class of digital functions.

SUMMARY OF THE INVENTION

These objects are achieved in the present invention by a novel asynchronous logic cell and an array formed of such cells. Each cell comprises a number of exclusive-OR gates, Muller C-elements and programmable switches. The array can be two- or three-dimensional. The design is well-suited for implementation in an integrated circuit "chip" using modern very-large-scale-integration (VLSI) techniques. The array may also be referred to as a "medium", for reasons which will become apparent. Such chips can themselves be assembled into arrays and other configurations. For clarity of expression, an array of chips will sometimes be referred to as a "matrix", to distinguish such an array from an array of cells internal to a chip. However, for most purposes it is not necessary to call attention to this distinction; generally, the array of cells can be disposed on one chip or many chips without the need to specify the implementation details. And a matrix (or portion of a matrix) can be extended freely in any dimension desired. Thus, computing power can be increased by simply adding more chips to the matrix.

The basic logic cell is reprogrammable and may even be reprogrammed dynamically, such as to perform recursive operations or simply to make use of hardware which is temporarily idle. Programming is accomplished by setting the states of the switches in each cell.

The invention provides a general-purpose architecture for computation and digital systems. Using an exemplary programming environment, the individual logic cells may be programmed and connected together to implement any circuit capable of being modelled as a broad class of Petri Nets having a known initial marking (i.e., placement of tokens). Great flexibility is therefore achieved. Configurations for (i.e., programs for setting cell switches to create) circuit blocks such as adders, multiplexers, buffer stacks, and so forth, may be stored in a library for future reference. With an adequate library, custom hardware can be designed by simply mapping stored blocks onto chips and connecting them together. This generates a tremendous savings in the time required for the development of many types of application-specific integrated circuits (ASIC's).

Moreover, for those circuits that are developed as Petri Net implementations, tools exist for analyzing the behavior of the resulting circuits.

The advantages of this approach are substantial. For example, it appears that virtually any microprocessor can be simulated in an array of such cells. Any of a number of microprocessors could be emulated, the choice being determined by the switch settings in the array. Further, the array is regular and switch settings can produce "logical wires", crossovers, connections, and routings (including right-angle bends and fan-outs) running both horizontally and vertically; consequently, it is generally possible to "wire around" defective elements. Due to this latter characteristic, the invention shows promise for so-called "wafer-scale" integration or fabrication. If a large wafer contains a few defective cells, those cells can simply be avoided and bypassed, with the remainder of the wafer remaining useful. This may permit the fabrication of much larger chips than has heretofore been possible, since defects normally render a chip useless.

The invention thus provides a powerful tool for general-purpose logic design and implementation.

The invention is pointed out with particularity in the appended claims. The above and further objects, features and advantages of the invention may be better understood by referring to the following detailed description, which should be read in conjunction with the accompanying drawing.

BRIEF DESCRIPTION OF THE DRAWING

In the drawing,

FIG. 15 shows at B, is a diagrammatic illustration of the transition and places of part A FIG. 15 after the transition has fired;

FIG. 17, at B, shows is an illustration of the schematic circuit symbol for an exclusive-OR gate in the present invention, for implementing the place of FIG. 17A;

FIG. 18, at B and C, shows schematic circuit diagrams for equivalent alternative implementations of the place of part A of FIG. 18;

FIG. 20, at B and C, shows schematic circuit diagrams for alternative implementations of the shared place of FIG. 20 at A;

FIG. 21 at B, shows an illustration of the schematic circuit for a C-element used for implementing the transition of FIG. 21 at A;

FIG. 22, at B, shows an illustration of the schematic circuit for an implementation of the transition of FIG. 22, at A, according to the invention;

FIG. 23, at B, shows an illustration of the schematic circuit for an implementation of the transition of FIG. 23, at A, according to the invention;

FIG. 24, at B, shows a schematic diagram of a circuit for assembling the three-input exclusive-OR gate of FIG. 24 at A from a pair of cascaded two-input exclusive-OR gates;

FIG. 24, at C, shows an illustration of a symbol for a three-input C-element;

FIG. 24, at D, shows a schematic diagram of a circuit for assembling the three-input C-element of FIG. 24 at C a pair of cascaded two-input C-elements;

FIG. 25, at B, shows a schematic diagram for a circuit implementation of the Petri Net of FIG. 25 at A;

FIG. 25, at C, shows a schematic diagram for a circuit implementation equivalent to that shown in FIG. 25 at B, with the placement of the inverter altered to take into account the geometry of the array, laid out as it can be implemented on the medium of the invention;

FIG. 25 at D, shows a listing of a program for setting the switches to produce the circuit of FIG. 25 at C, with the relative positions of the program's hexadecimal instructions corresponding to the relative positions of the associated switches;

FIG. 25 at E, shows a diagrammatic symbol for a block representation of the circuit of FIG. 25 at C.

DETAILED DESCRIPTION OF ILLUSTRATIVE EMBODIMENTS

The Cell

Each logic cell according to the invention comprises a number of elements used exclusively within that cell, as well as a number of elements shared by that cell and adjacent cells, to the extent there are adjacent cells. When viewed in vacuo, a cell has nine exclusive-OR ("XOR") gates, four Muller C-elements ("C-elements") and twelve programmable switches. When embedded in a two-dimensional array, however, each of the XOR gates and programmable switches on the faces of a cell is shared with another cell, and each of the C-elements (which are at the corners of the cell) is shared with three other cells. Due to the sharing of C-elements and the exterior XOR gates and switches, as the size of the array grows larger, the average component count approaches, on a per-cell basis, a limit of seven XOR gates, one C-element and eight switches.

Figure 1A:
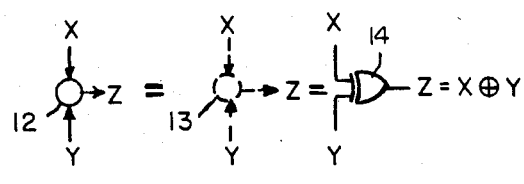
FIGS. 1A–1F are illustrations of a set of novel circuit symbols used herein to represent the elements of the present invention, and the corresponding conventional symbols used for such elements.
Figure 1B:
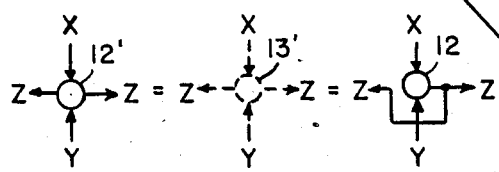
Figure 1F:
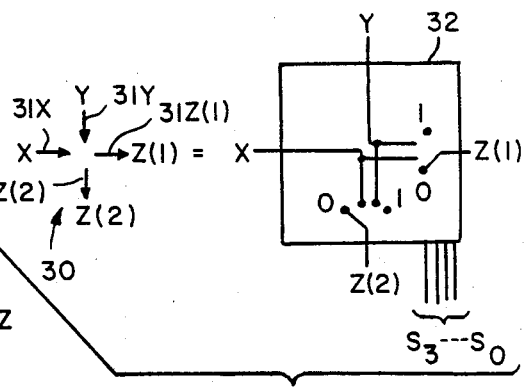

Unconventional symbols are used to represent these elements to facilitate comprehension of the diagrams. The unique symbols used herein are shown in FIGS. 1A-1F, with their conventional counterparts. The plain, unfilled circle 12 in FIG. 1A represents an exclusive-OR gate whose conventional symbol is shown at 14; an alternate, equivalent symbol 13 is used in a context described below. A double output connection may, for convenience, be shown as at symbols 12' and 13' in FIG. 1B.

Figure 1C:
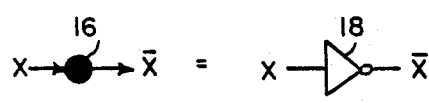

The exclusive-OR gates are used in three ways: as disjunctive elements, as "wires", and as inverters. To see how the exclusive-OR gate functions as a disjunctive element, notice that whenever there is a transition (from 0 to 1 or from 1 to 0), on either input, there is a subsequent transition on the output. The exclusive-OR gate, therefore, acts as a "merge" for transitions. The effect of a "wire" is achieved by setting to zero one of the two inputs of an exclusive-OR gate, as a result of which the gate's logical output level corresponds to the logic level at its other input. Because this is not a physical wire, per se, it is referred to herein as a "logical" wire. An exclusive-OR gate is turned into an inverter by setting one of its inputs to one; the value of the output is then the negation of the value on the other input. The symbol for an inverter is shown in FIG. 1C at 16, together with the conventional symbol 18.

Figure 1D:
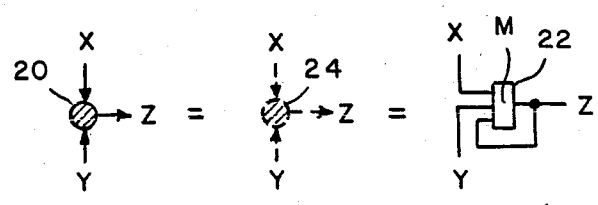
Figure 1E:
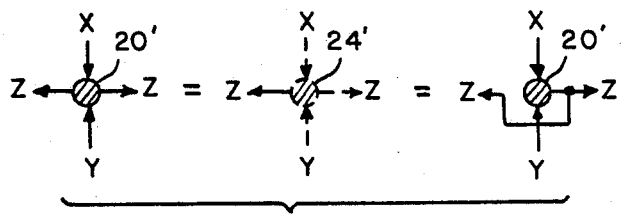

The second elemet of the cell, the C-element is illustrated in FIG. 1D by the symbol 20. A variety of other symbols have been used in the past for this element, including the symbol 22. For reasons which will become apparent below, a new, alternate symbol 24 is also used herein in some situations to represent a C-element. When a C-element driving two outputs is required, the symbol 20' or 24' may be used for convenience, as illustrated in FIG. 1E.

The C-element (the "C" stands for consensus) is a conjunctive device and is also called a "rendezvous", "join", or "last of" circuit. It is described in the literature, such as in C. Mead and L. Conway, *Introduction to VLSI Systems*, Addison-Wesley Publishing Co., Reading, Massachusetts, 1980, at 254–255, and a suitable circuit is shown there. The C-element is a bistable device with an arbitrary number of inputs and a single output. The output provides the consensus of the inputs. That is, if all inputs are 0, then the output is 0; if all inputs are 1, then the output is 1; if the inputs are not all the same value, then the output retains the value of the most recent consensus, when all inputs had the same value. Thus, a C-element whose output is 0 will not change its output to 1 until all of its inputs are 1; and conversely, a C-element whose output is 1 will not change its output to 0 until all of its inputs become 0.

The present cell uses only two-input C-elements. A two-input C-element is logically equivalent to a 3-input majority voting circuit (i.e., a 2 out of 3 circuit) which has its output connected to one of its inputs, as represented by symbol 22.

The programmable switches provide the capability of programming the cells and the array for different tasks by changing interconnections. Each switch is represented as in symbol 30 in FIG. 1F. Each switch 30 has two input wires 31X and 31Y and two output wires 31Z(1) and 31Z(2). There are also four conductors (assuming parallel operation) for controlling the state of the switch, but they are not shown in the drawing symbol. The switch 30 (more accurately termed a switch assembly) is the equivalent of the pair of single-pole, four-throw switches (or multiplexer) 32, which are controlled by four bits S0–S3 to provide the switching arrangement now described. Each of the two outputs 31Z(1) and 31Z(2) of switch 30 (or 32) can be programmed in four different ways: (1) to connect to a first input, such as 31X; (2) to connect to a second input, such as 31Y; (3) to be set to zero; or (4) to be set to one. Switches are, according to a convention established at this point, always depicted with one input and one output aligned horizontally and with the other input and the other output aligned vertically. This allows adoption of the following convention for the meaning of the four bits S0–S3 used to program the switches:

| S3 | S2 | S1 | S0 | Meaning |
|---|---|---|---|---|
| 0 | 0 | X | X | Horiz. output set to zero |
| 0 | 1 | X | X | Horiz. output connected to vert. input |
| 1 | 0 | X | X | Horiz. output connected to horiz. input |
| 1 | 1 | X | X | Horiz. output set to one |
| X | X | 0 | 0 | Vert. output set to zero |
| X | X | 0 | 1 | Vert. output connected to vert. input |
| X | X | 1 | 0 | Vert. output connected to horiz. input |
| X | X | 1 | 1 | Vert. output set to one |

In the foregoing table, the "X" symbol in a column means that the value of the bit identified at the head of that column does not enter into the decoding shown in the right hand column. That is, the first two bits S0, S1, and the last two bits S2, S3 are interpreted independently. By way of example, 1101 (hexadecimal "D") means that the horizontal output is set to 1 and the vertical output is connected to the vertical input.

The Array

The array (or, as it is also called, the "computational medium") is a uniform matrix of exclusive-OR gates, C-elements and programmable switches. As exemplified herein, the matrix is two-dimensional, but it can be adapted readily to three dimensions in various ways. The array may be of arbitrary size; and its boundary, of arbitrary shape. The present illustration is limited, however, for simplicity, to arrays or portions of arrays containing integral numbers of cells. A representative portion of such an array (containing nine cells) is shown at 40 in FIG. 2.

The Cell

Figure 3:
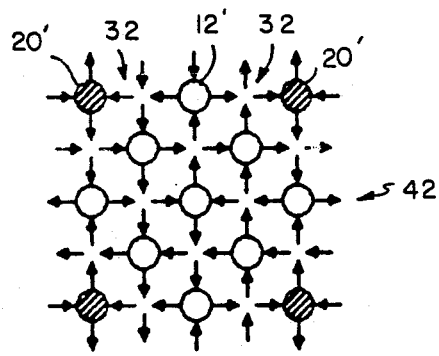
FIG. 3 is a diagrammatic illustration of a single logic cell according to the invention, including some elements which are shared with neighboring cells when the cell is embedded in an array.

The standard cell 42 is depicted in FIG. 3. Since a single cell is shown divorced from the array, it contains nine XOR gates 12', four C-elements 20', and twelve programmable switches 32.

Programming

Programs for the computational medium consist of arrays of bits: four for each programmable switch. These bits act to program a circuit in the medium, and transform the general-purpose environment of the medium into a special-purpose device.

Figure 26:
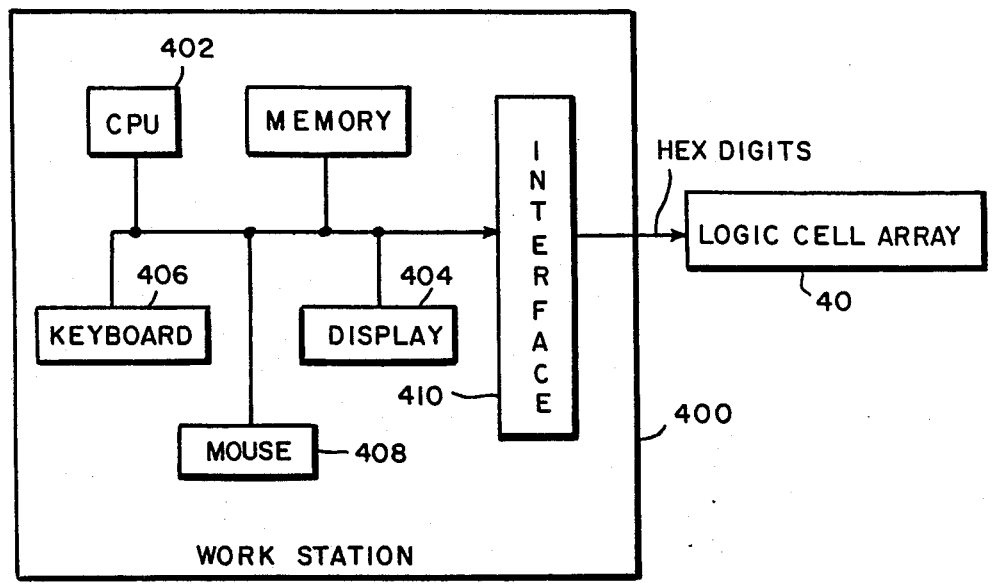
FIG. 26 is a block diagram depicting the hardware elements of a system for programming a logic cell array in accordance with the present invention.

A work station is employed for accomplishing the programming of the medium. The work station is equipped with a number of "tools" to assist the programmer. The tools take the form of special programs and displays to facilitate the visualization of the transformation of the medium from a "blank template" to a special-purpose piece of hardware. (A blank template corresponds to a medium in which the outputs of all switches are set to zero.) The work station itself may be a personal computer or engineering computer-aided design station or the like such as workitation 400 of FIG. 26, having a processor 402, a video display device 404 and some form of input selection and control mechanism (e.g., keyboard 406, "mouse 408", joystick, etc.). Using the work station, several "views" of the medium are available.

To program a blank medium or segment of medium, the user calls a display screen which serves as a background template depicting the unprogrammed medium. The template may be displayed as a dimmed copy of the medium of FIG. 2 or it may be a different color or possess some other attribute to show that it is only a background to assist the designer.

Figures 4, 5:
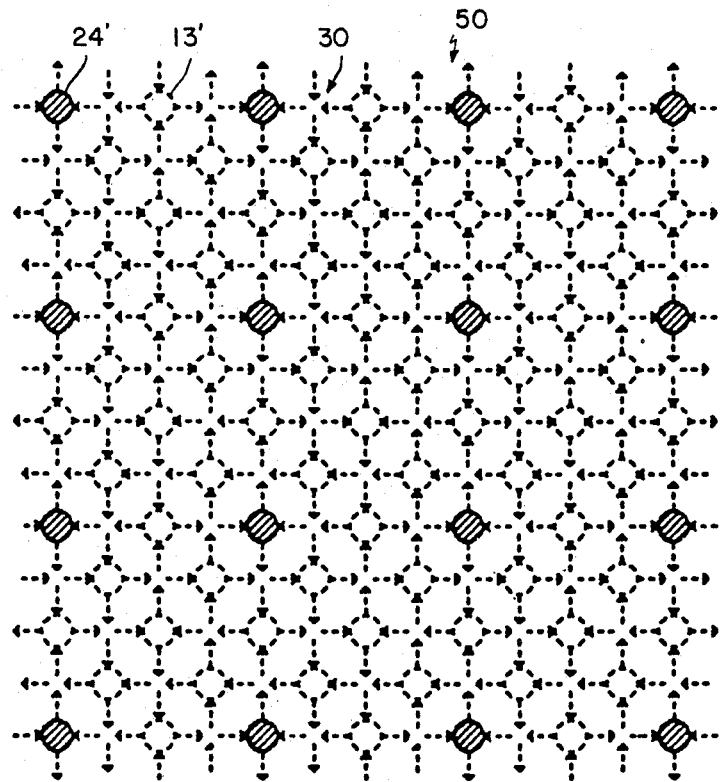
FIG. 4 is an illustration of an exemplary work station display of a template for use in programming the medium of FIG. 2.
FIG. 5 is an illustration of an exemplary program, in hexadecimal notation, for the switch settings for an area of two-by-three cells, for generating a typical circuit.

Various approaches may be taken to establish switch settings. In a typical work station employing a "mouse" as a pointer, for example, a switch may be set by moving the mouse to select a switch output first and to then select an input to the switch (or visa versa); this sequence is interpreted as requiring the output and input to be connected, and a corresponding switch-setting to be generated. On the display, the input and output connections are emphasized (e.g., darkened, solidified, or shown in another color). In a similar fashion, an exclusive-OR gate's input may be selected and set to zero or to one to create a logical wire or an inverter, respectively. On the display the gate may be transformed to the symbol for an inverter or to a simple wire symbol. Referring now to FIG. 4, the numeral 50 identifies a section of the medium represented in a template form. To identify the fact that this is just a template (i.e., an unprogrammed portion of the medium) and to distinguish it from a programmed area of the medium, all lines in the template section 50 are dashed instead of solid and the alternative symbols 13' and 24' are used for the XOR gates and C-elements, instead of the symbols 12 and 20.

Now, taking a representative array in the medium comprising an area of two-by-three cells, FIG. 5 shows a program 55, in hexadecimal notation, for generating a circuit by programming that area. To facilitate interpretation of the program, the spacing of the hexadecimal digits corresponds to the spacing of the switches in FIG. 4. Each of the hexadecimal digits in the program of FIG. 5 represents the setting of a particular switch in a corresponding location in FIG. 4, according to the assignments of bits S0-S3 set out above.

Each time a switch is updated using the "mouse", for example, a hexadecimal digit is generated corresponding to the new switch setting. Referring again to FIG. 26, each hexadecimal digit is fed to the switches of an array 40 via an interface 410. Using this hexadecimal digit, the work station appropriately modifies the display to show the circuit so indicated.

Figure 6:
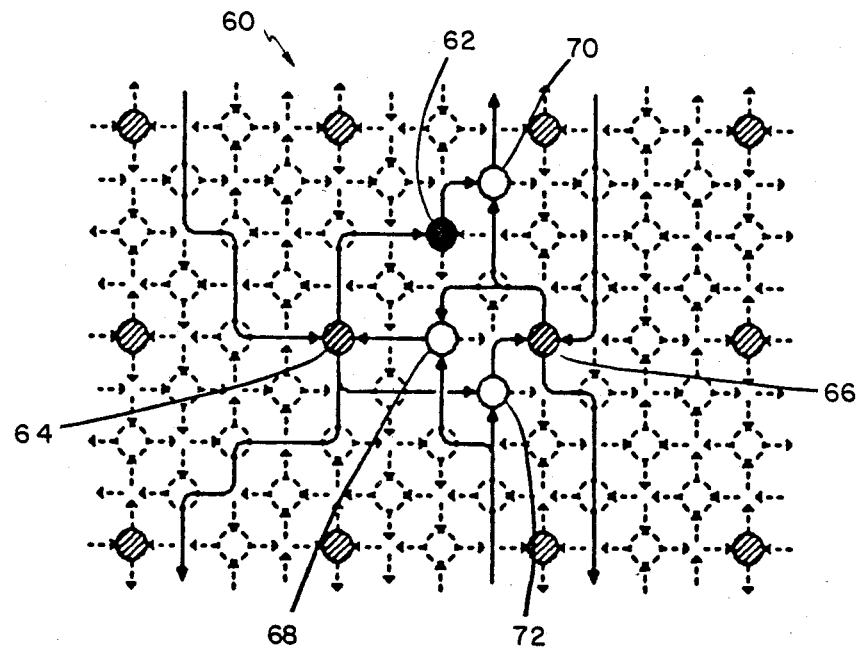
FIG. 6 is a partially diagrammatic, partially schematic illustration showing the circuit generated by the program of FIG. 5, overlaid on the template of FIG. 4.
Figure 7:
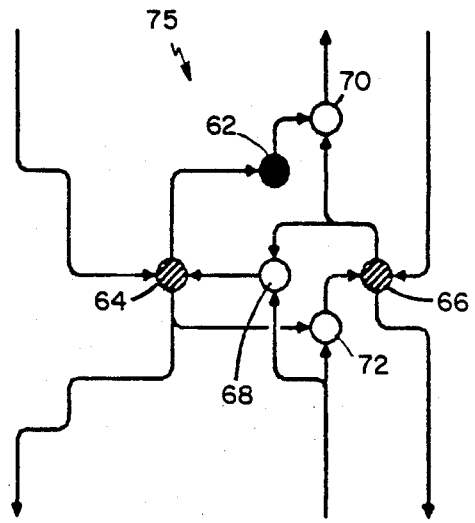
FIG. 7 is a partially diagrammmtic, partially schematic illustration of the circuit of FIG. 6, freed from the template.

FIG. 6 shows the circuit 60 generated by the program 55 of FIG. 5, overlaid on the template 50. The circuit has one inverter 62, two C-elements 64 and 66, and three exclusive-OR gates 68, 70 and 72. Various switch settings convert selected switches and exclusive-OR gates into logical (but, of course, not physical) wires; some of the wire segments are straight horizontal or vertical runs, while others involve bends or fan-outs. The circuit of FIG. 6 is displayed at 75 in FIG. 7, freed from the template.

An exemplary program has been developed for programming the medium with the aid of a personal computer. This program uses a "mouse", or the like, for moving an on-screen pointer (or cursor) to a "wire" (i.e., an input or an output of a switch, XOR gate, or C-element) which is to be acted upon. Once the mouse has been used to point to a wire, two buttons may be employed for specifying the action to be taken. These buttons are denominated the "select" button and the "option" button, respectively. They may be on the mouse, on the work station keyboard, or elsewhere. Assuming there is no outstanding selection of a wire, when the select button is depressed, the wire thereby indicated is made to blink off and on, to verify its selection. When the pointer is moved and a second wire is selected, it may or may not be a wire that can be connected with the first wire. (The only way switches are set is by connecting inputs and outputs, or by setting wires to one or zero.) If the second wire can be connected to the first wire, the connection is made; otherwise, the first wire is de-selected and the second wire takes its place as the selected wire.

Thus far, it has been assumed that the option button has not been used. If the option button is depressed when the select button is pressed (to designate a wire), then one of the following actions occurs: If the designated wire is connected through a switch to another wire(s), then the connection(s) is (are) broken. If the designated wire is an output of a switch that is not connected through that switch to another wire, the logical value of that wire is inverted.

The work station program for drawing circuits preferably obeys the following rules: When a switch output is connected to one of its inputs, the input and output wires of the switch are highlighted (e.g., drawn as solid lines) and a solid connection is made within the switch. An exclusive-OR gate is highlighted (i.e., shown as an exclusive-OR gate with a solid outline symbol 12') if both of its input wires have been highlighted; that is, if both of its inputs are connected to other elements rather than being set to zero or one. An exclusive-OR gate is depicted as an inverter, symbol 16, if one of its inputs is set to logical one. If a first input of an exclusive-OR gate and its output are connected to highlighted wires, and the second input is set to zero, the gate is replaced by a wire between its first input and its output. A C-element is highlighted (i.e., shown as a C-element with a solid border, using symbol 20) if either of its input wires is highlighted or set to one.

Figure 2:
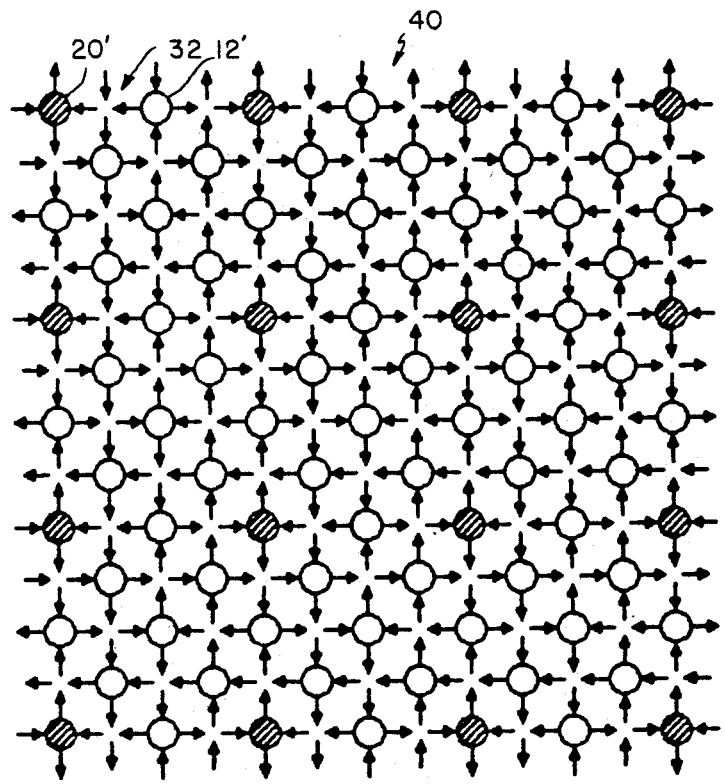
FIG. 2 is a diagrammatic illustration of a portion of the medium.
Figure 8:
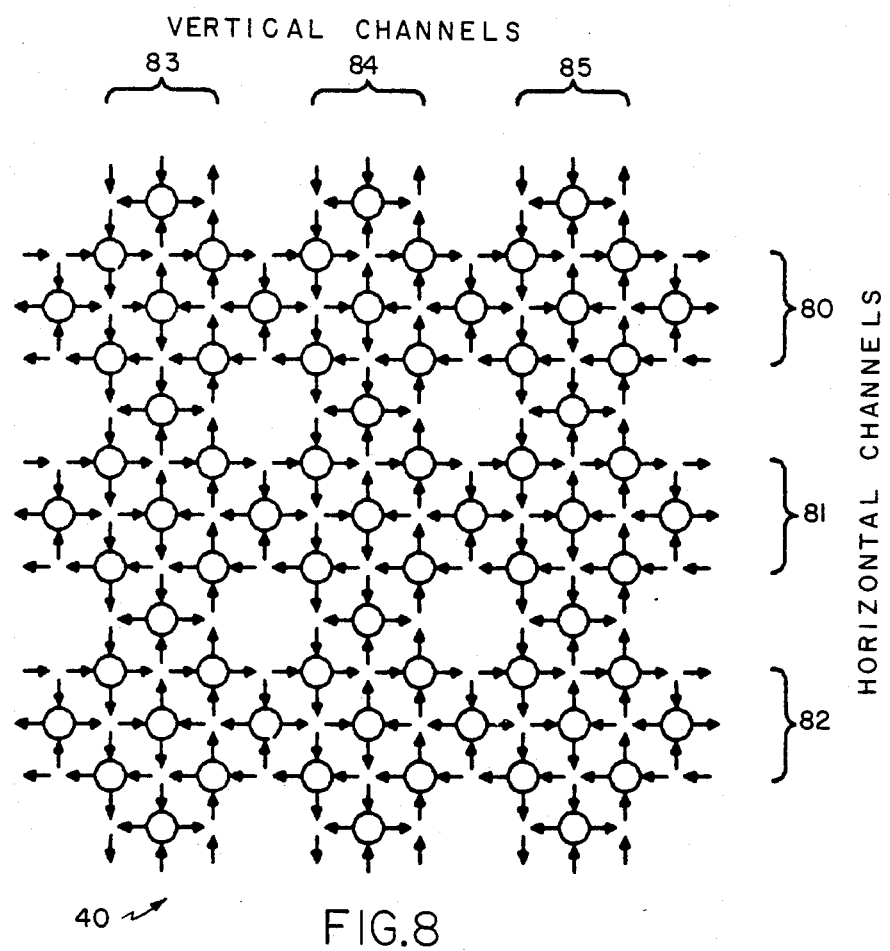
FIG. 8 is a diagrammatic illustration of a portion of the medium with C-elements excised, showing the existence of horizontal and vertical "channels;"
Figure 9:
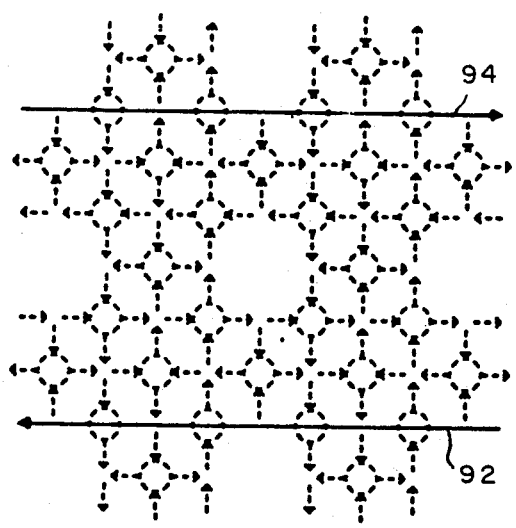
FIG. 9 is a diagrammatic illustration of a template of the medium showing the creation of logical "wires" in the horizontal direction.
Figure 10:
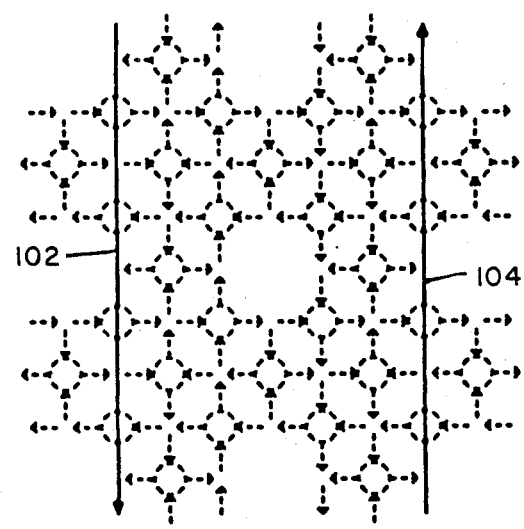
FIG. 10 is a diagrammatic illustration of a template of the medium showing the creation of logical "wires" in the vertical direction.
Figure 13:
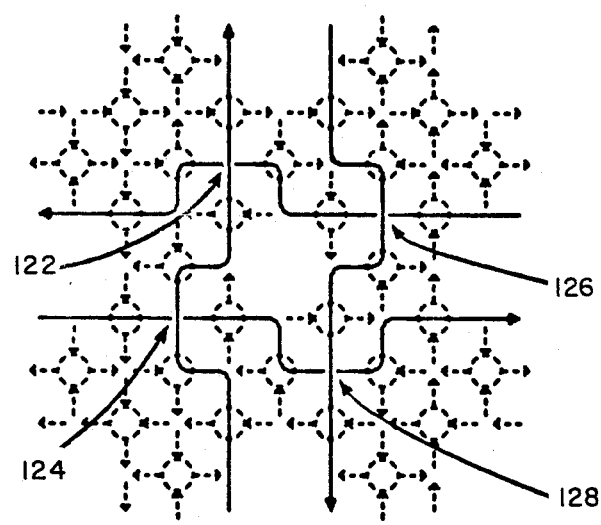
FIG. 13 is a diagrammatic illustration of a template of the medium showing the creation of crossovers for logical "wires" running in orthogonal directions.
Figure 11:
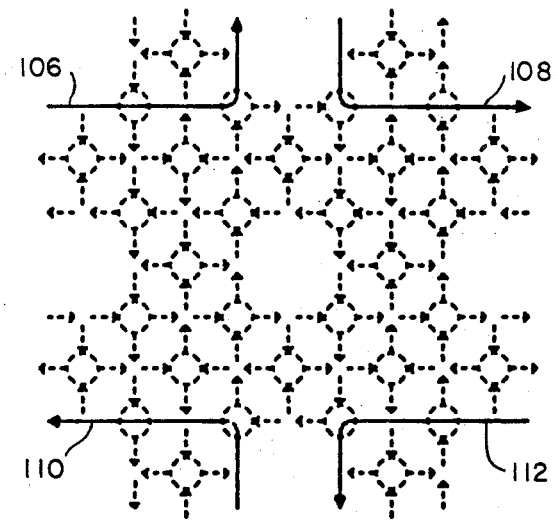
FIG. 11 is a diagrammatic illustration of a template of the medium showing the creation of logical "wires" with right-angle bends.
Figure 12:
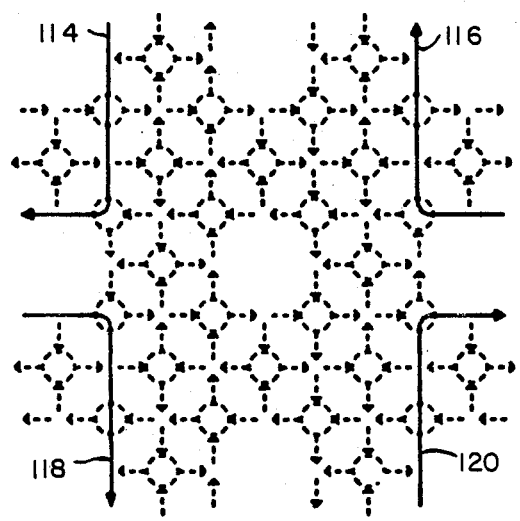
FIG. 12 is a diagrammatic illustration of a template of the medium showing the creation of additional logical "wires" with right-angle bends.

The array structure 40 of FIG. 2 possesses some interesting and important properties. In FIG. 8, the C-elements have been excised to show how the exclusive-OR gates and switches form bi-directional horizontal "channels" 80-82 and vertical "channels" 83-85. The existence of these channels facilitates the creation of wires running horizontally (as at 92 and 94 in FIG. 9) and vertically (as at 102 and 104 in FIG. 10) across the medium or portions thereof. By combining horizontal and vertical channels, various kinds of ninety-degree bends can be created, as shown in FIGS. 11 and 12 at 106-120. Equally as important, vertical crossovers and horizontal crossovers can be established, as represented at 122-128 in FIG. 13.

Petri Net Implementations

Figure 14:
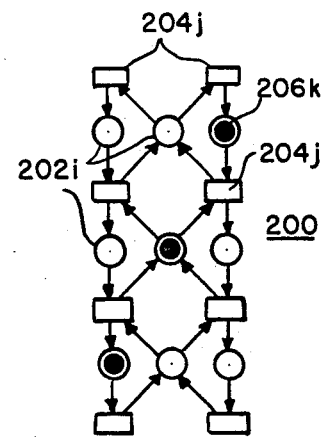
FIG. 14 is a diagrammatic illustration of a representative Petri Net.
Figure 15:
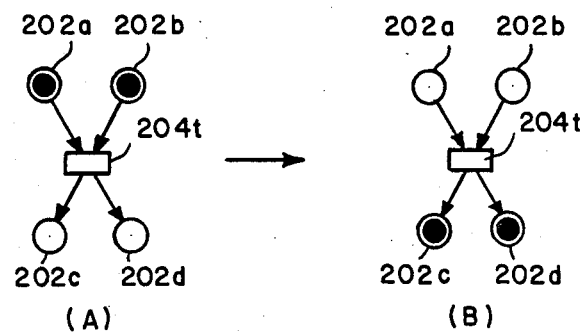
FIG. 15 shows at A, a diagrammatic illustration of an enabled transition having two input places and two output places.
Figure 16:
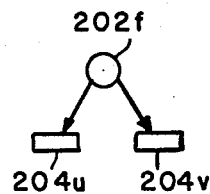
FIG. 16 is a diagrammatic illustration of a shared input place in a Petri Net (i.e., a place that is an input place to multiple transitions)

Referring to FIG. 14, which depicts a representative Petri Net 200, the circles $202i$ represent places, the rectangular boxes $204j$ represent transitions and the small black dots $206k$ represent tokens. As discussed earlier, a place may be identified as an input place of a transition or as an output place of a transition. Pictorially, this is illustrated in parts A and B of FIG. 15; there, places $202a$ and $202b$ are input places to transition $204t$, while places $202c$ and $202d$ are output places to transition $204t$. The graphical representation of the firing of transitions also may be observed in parts A and B of FIG. 15. In FIG. 15A, each of input places $202a$ and $202b$ contains a token. Transition $204t$ is thus enabled to fire. Once that transition fires, the condition of the Petri Net is as shown in FIG. 15, at B. That is, a token has been taken from each of places $202a$ and $202b$ and a token has been placed in each of places $202c$ and $202d$. FIG. 16 portrays a shared input place. That is, place $202f$ is shared by transitions $204u$ and $204v$.

The class of Petri Nets which can be implemented using the present invention are those Petri Nets wherein: (1) the net is "safe", (2) the net is "persistent", (3) each transition has no more than two shared input places, and (4) any transition with two shared input places has no other input places. For definitions of these terms, see, e.g., J. L. Peterson, *Petri Net Theory and the Modeling of Systems*, Prentice-Hall, Inc., Englewood Cliffs, N.J., 1981.

The implementation of such Petri Nets electrically requires the establishment of a correspondence between tokens and electrical signals. In a digital circuit, the components produce transitions from logical zero to logical one and from logical one to logical zero. Suggested Petri Net implementations have interpreted these electrical transitions in two different ways. These two ways have been called "simple signalling" and "reset signalling". See E. Pacas-Skewes, "A Design Methodology for Digital Systems Using Petri Nets," PhD diss., Univ. of Texas at Austin, 1979. In simple signalling, a transition of level (either 0 to 1 or 1 to 0) is identified with a token. In reset signalling, by contrast, only a 0 to 1 transition represents a signal; the opposite transition is treated as a reset event. Thus, a level 1 is commonly identified with a token; and a level 0, with the absence of a token. This invention may be used with either simple signalling or reset signalling; however, throughout this discussion, the use of simple signalling is presumed.

The use of simple signalling complicates the implementation of nets having shared input places. The electrical transition arriving at a shared place is sensed by all the circuits that implement the transitions which share that place. However, since there is no resetting event, extra circuitry is required to "cancel" the signal from the shared place once it has been "consumed" by one of the transitions.

Figure 17:
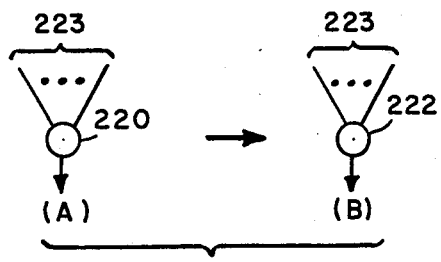
FIG. 17 shows, at A an illustration of the diagrammatic symbol used to represent, in a Petri Net, an unshared place of arbitrary fan-in when the place has no token in the initial marking of the net.
Figure 18:
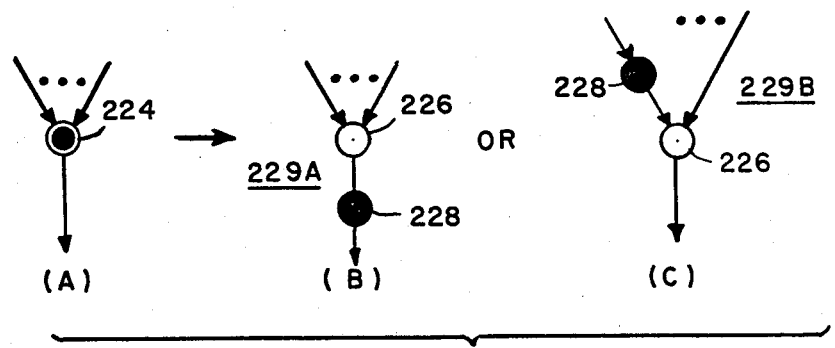
FIG. 18, at A, shows an illustration of the diagrammatic symbol used to represent, in a Petri Net, an unshared place of arbitrary fan-in, when the place has a token in the initial marking of the net.

FIGS. 17-23 depict, pictorially, the correspondences between various Petri Net components and their circuit realizations according to the invention. In FIG. 17, the series of dots 223 represent arbitrary fan-in. An unshared place 220 of aribitrary fan-in, as in FIG. 17 at A, is implemented by an XOR gate 222 with equivalent fan-in, as in FIG. 17 at B. When the unshared place (in an initial marking) has a token, as at 224 in FIG. 18, part A, it is implemented with an XOR gate 226 and an inverter 228 arranged in one of two equivalent forms, shown in FIG. 18 at parts B and C, respectively, at 229A and 229B.

Figure 19:
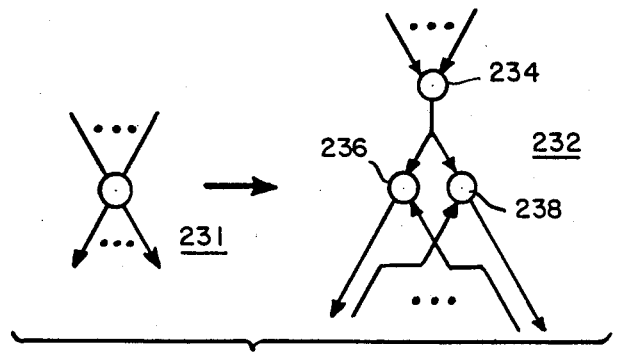
FIG. 19 is an illustration of the diagrammatic symbol used to represent a shared place in a Petri Net, when the place has no token in the initial marking of the net 1, and also is an illustration of the schematic circuit for an implementation of that shared place.
Figure 20:
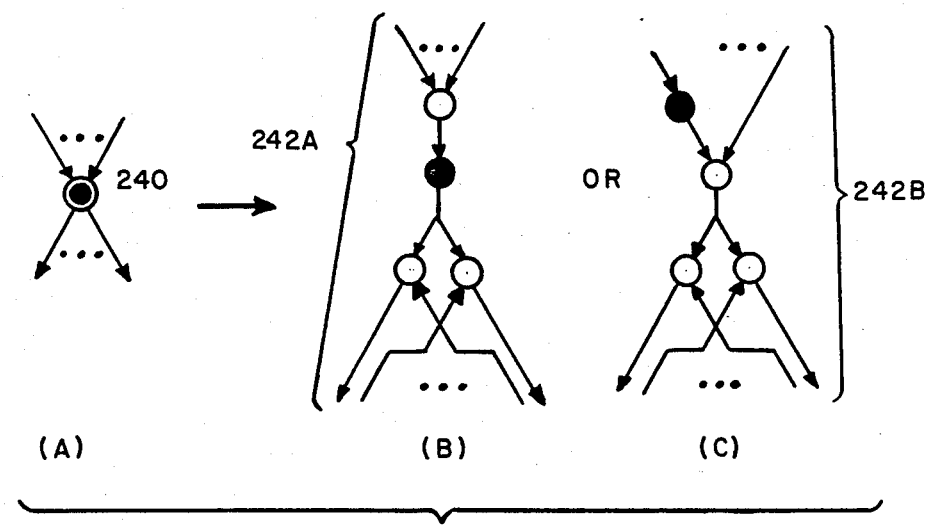
FIG. 20, at A, shows an illustration of the diagrammatic symbol used to represent a shared place in a Petri Net, when the place has a token in the initial marking of the net.

An n-input place whose output is shared by two or more transitions, element 231 in FIG. 19, part A, is realized by three XOR gates 234-238 interconnected as shown at 232 in FIG. 19, part B. The realization for a shared n-input place with a token, element 240 in FIG. 20 at A, may take one of two equivalent forms, as shown in FIG. 20 at B and C, respectively, at 242A and 242B.

Figure 21:
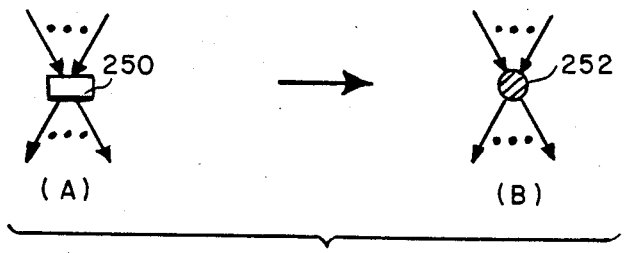
FIG. 21 at A, shows an illustration of the diagrammatic symbol used to represent, in a Petri Net, a transition with no shared input places.
Figure 22:
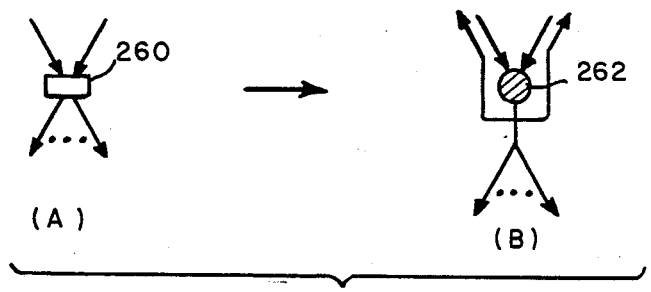
FIG. 22 at A, shows an illustration of the diagrammatic symbol used to represent, in a Petri Net, a transition with two shared input places and arbitrary fan-out.
Figure 23:
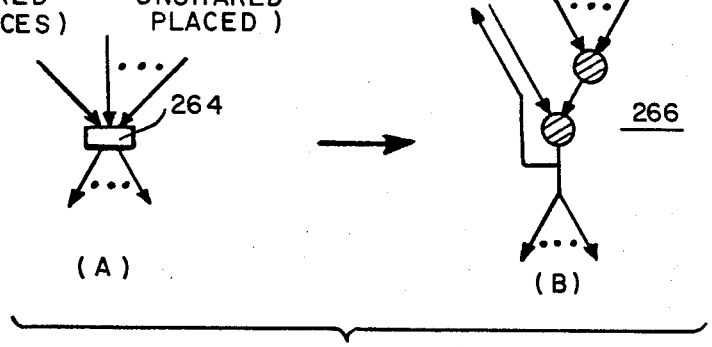
FIG. 23, at A, shows an illustration of the diagrammatic symbol used to represent, in a Petri Net, a transition with an arbitrary number of unshared input places, one shared input place, and arbitrary fan-out.

The Petri Net symbol for a transition with an arbitrary number of unshared input places and arbitrary fan-out is shown at 250 in FIG. 21, part A; it is realized by a corresponding C-element of arbitrary fan-in and fan-out, as shown at 252 in FIG. 21, part B. The Petri Net symbol for a transition with two shared input places and arbitrary fan-out is shown at 260 in FIG. 22, part A, its realization is shown at 262 in FIG. 22, part B1, the realization comprises a two-input C-element whose output feeds back to the input places as well as forward to the next stage. A hybrid of FIG. 21 part A, and FIG. 22, part A, is shown in FIG. 23 at A, which depicts a Petri Net symbol for a transition 264 with one shared input state, an arbitrary number of unshared input states and arbitrary fan-out. The realization of the transition 264 can be accomplished with the circuit 266 of FIG. 23 at B, comprising a C-element of arbitrary fan-in cascaded with a two-input C-element.

Figure 24:
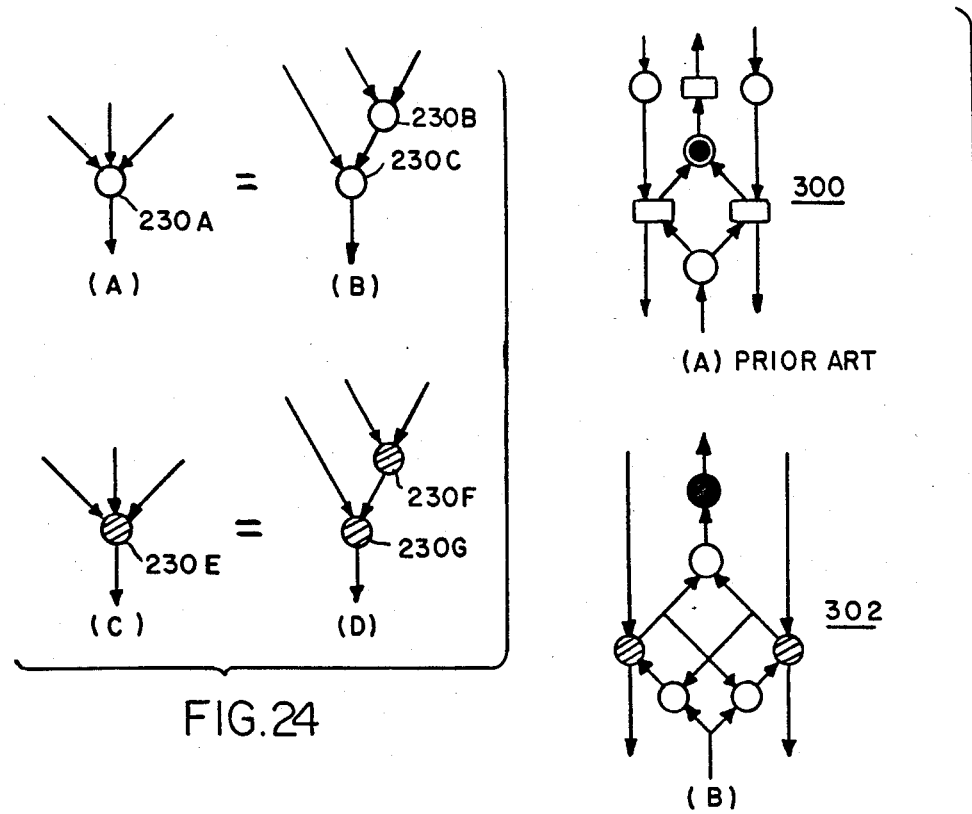
FIG. 24, at A, shows an illustration of a symbol for a three-input exclusive-OR gate.

To form exclusive-OR gates and C-elements of arbitrary fan-in, the two-input exclusive-OR gate and C-element shown in FIGS. 1A-1E can be cascaded. For example, the three-input exclusive-OR gate 230A of FIG. 24, part A can be implemented using a pair of cascaded two-input exclusive-OR gates 230B and 230C, connected as shown in FIG. 24, part B. And the three-input C-element 230E of FIG. 24, part C can be realized from a pair of cascaded two-input C-elements 230F and 230G, connected as shown in FIG. 24, part D.

Figure 25:
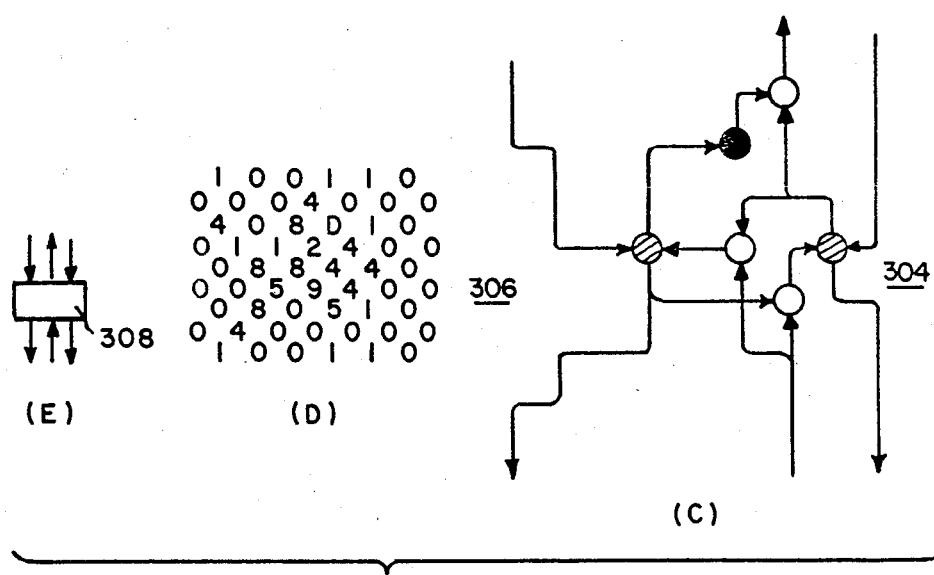
FIG. 25, at A, shows a diagrammatic illustration of a Petri Net representation for a single stage of a bit pipeline.

FIG. 25 shows, for a simple example, the progression from a Petri Net 300 in FIG. 25, part A to a corresponding circuit 302 (FIG. 25, part B) to an implementation of the circuit 304 as it might be laid out in an array of cells in the computational "medium" of the invention. Only the elements used to implement the circuit are shown in FIG. 25 at C, of course.

The circuit of FIG. 25 at C is be produced by the program 306 shown in FIG. 25 at D. And once the program has been generated, the circuit (in the form of the program) can be stored as a "block" for subsequent recall and reuse. In that form, it can also be displayed on the work station screen as a block, such as block 308 in FIG. 25, part E.

Once a library of useful blocks has been programmed and stored, large systems can be programmed quickly by recalling blocks, locating them on the array and interconnecting them to achieve the desired functions.

The invention thus provides a general-purpose hardware medium, much like a high-level programming language provides a general-purpose programming environment.

Initializing the Array

When the array is used to implement a Petri Net, it is necessary to generate in the array a manifestation identifiable with the tokens which propagate in the net. As explained above, tokens are identified with logic-level transitions when simple signalling is used. Consequently, the initial tokens of a marked Petri Net are identified with the initial transitions in the circuit. These initial transitions are created through the use of inverters. Before the medium is programmed, all outputs of all switches are set to zero. Next, all switches are programmed, except that the outputs of (exclusive-OR gates used as) inverters are left disconnected. The inverter outputs are then connected, thereby releasing initial transitions into the circuit.

Recap

The invention thus provides an array structure containing but three types of elements: a single type of conjunctive element, a single type of disjunctive element and a single type of switch for interconnecting those elements. The resulting array permits an extremely high degree of concurrent operation, since cells may operate largely independently of one another. It is even possible that different parts of the array structure may not interact with each other.

Muller C-elements are used as the conjunctive elements and exclusive-OR gates are used as the disjunctive elements, but it may be possible to replace these particular circuit types with other conjunctive and disjunctive elements. Further, with other types of disjunctive and conjunctive elements, tokens may be identified with manifestations or effects other than logic-level transitions. For example, token might be identified with an electrical effect such as charge (if charge-coupled devices are employed), with a magnetic effect such as magnetic domains (if magnetic bubbles are used) or with optical or fluidic effects. The switches then become, broadly speaking, means for routing the selected effects or manifestations between and among the disjunctive and conjunctive elements.

Topologically, the array may be considered a bipartite structure having as two types of nodes: the switches, on the one hand, and the conjunctive/disjunctive elements on the other hand.

The programming environment for the array (or medium) frees the hardware designer from the need to be a programmer also. That is, the designer builds a circuit in the medium by simply pointing on a work station screen to switch inputs and outputs and setting them to the desired conditions. The designer also can build circuits by selecting blocks from a library and interconnecting them; finally he can "lay out" circuits on a chip right on the work station screen.

The medium is readily reprogrammed, since all that is required is to feed it new switch settings.

Having thus described an exemplary embodiment of the invention, it will be apparent that various alterations, modifications and improvements will readily occur to those skilled in the art. For example, the circuitry for the switches and one or more types of the other elements might be merged. Or other topologies might be employed, such as extending the array or portions of the array into three dimensions. In so doing, element fan-in and/or fan-out might be changed, e.g., from two to three. Reset signalling might be employed, instead of only simple signalling. And the array or portions of the array could be rotated or reflected to orientations other than shown in the drawing. Such obvious alterations, modifications and improvements, though not expressly described above, are nevertheless intended to be implied and are within the spirit and scope of the invention. Accordingly, the foregoing discussion is intended to be illustrative only, and not limiting; the invention is limited and defined only by the following claims and equivalents thereto.

What is claimed is:

1. A method of generating programming instructions for configuring an array of programmable logic cells which comprise logic elements and programmable switch assemblies, each of such switch assemblies including at least one signal input lead and at least one signal output lead; such method comprising, on a work station having a display screen, input means, and a programmed processor for generating on the display screen displays of symbols representing logic elements, switch assemblies and their connections and for processing input from the input means, the steps of:
   a. providing on the display screen a template representing an unprogrammed array of switches; and
   b. generating a programming instruction in response to signals from the input means, such signals representing (i) selection of an output lead of a switch and (ii) selection of a source from among (a) an input lead of the switch, (b) a logical one signal and (c) a logical zero signal; said generating step providing such programming instruction in a form usable by the array of cells to configure said switch assembly to connect the selected output lead to the selected source.

2. The method of claim 1 wherein the programming instruction comprises a group of bits coded to effect the selected connection.

3. The method of claim 1, wherein step b is repeated for each switch assembly which is to be programmed.

4. The method of claim 1 further including the step of displaying on the display screen a listing of the generated switch programming instructions, with each programming instruction positioned on the display in the same position as the corresponding switch assembly in the array.

5. The method of claim 1, further including the step of changing the display on the display screen to indicate visually the then currently selected switch lead.

6. The method of claim 5 wherein the display is changed by changing a visual attribute of the selected switch lead.

7. The method of claim 1, further including the step of changing the display on the display screen to indicate visually the effect which is produced by programming the switch assembly with said programming instruction.

8. The method of claim 7 wherein the programming of the switch assembly is indicated by replacing a switch symbol on the display with a wire symbol connecting the selected signal input lead and the selected signal output lead when such leads are to be connected.

9. The method of claim 7 wherein the programming of the switch assembly is indicated by replacing the symbol of the logic element connected to the selected output lead thereof with a different symbol when the selected output lead of the switch assembly is to be connected to one of the logical one and logical zero sources.

10. The method of claim 1 further including the step of displaying the circuit which will be formed in the array by the programming of the switch assemblies with said programming instructions.

11. The method of claim 10 wherein the circuit is displayed in juxtaposition with a template representing the unprogrammed array.

12. The method of claim 11 wherein the circuit is superimposed on the template.

13. A method useful in connection with generating programming instructions for configuring an array of programmable logic cells comprising logic elements and programmable switch assemblies; each programmable switch assembly having first and second signal input leads, first and second signal output leads, a zero input for connection to a logical zero source and a one input for connection to a logical one source; each of the switch assembly signal input leads and signal output leads being termed a "signal lead"; such method including, on a work station having a display screen, input means, and a programmed processor for generating displays for the display screen and for processing input from the input means, the steps of:
   a. providing on the display screen a template representing an unprogrammed array of cells; and
   b. responsive to an input signal from the input means, which input signal designates a first signal lead, producing on the display screen a visual manifestation of such designation.

14. The method of claim 13 wherein the step of producing a visual manifestation of signal lead designation comprises the operation of causing a change in a display attribute of the lead.

15. The method of claim 13 including the further step of
   c. responsive to further signals from the input means, corresponding to designation of a second signal lead of the same switch assembly connectable to the first signal lead, generating a programming instruction usable by the array of cells to program the switch assembly to connect the first signal lead with the second signal lead.

16. The method of claim 15 including the further step of:

d. displaying on the display screen a visual representation of the connection of the first signal lead with the second signal lead.

17. A method of generating programming instructions for configuring an array of programmable logic cells each of which comprises a plurality of logic elements and at least one programmable switch assembly; each programmable switch assembly being programmable to assume one of a predetermined number of states in response to a programming instruction; such method including, on a work station having a display screen, input means, and a programmed processor for generating displays for the display screen and for processing input from the input means, the steps of:
  a. providing on the display screen a template representing an unprogrammed array of cells;
  b. receiving from the input means a signal representing the intended state of a switch assembly selected from among the available states; and
  c. generating a programming instruction for programming the switch assembly to assume the intended state.

18. The method of claim 17 including the further step of producing on the display screen a visual manifestation of such state selection.

* * * * *